United States Patent
Hu et al.

(10) Patent No.: US 7,902,650 B2
(45) Date of Patent: Mar. 8, 2011

(54) SEMICONDUCTOR PACKAGE AND METHOD FOR MANUFACTURING THE SAME

(75) Inventors: Chia Chien Hu, Kaohsiung (TW); Chao Cheng Liu, Kaohsiung County (TW); Chien Liu, Kaohsiung County (TW); Chih Ming Chung, Tainan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/464,334

(22) Filed: May 12, 2009

(65) Prior Publication Data
US 2009/0289339 A1    Nov. 26, 2009

(30) Foreign Application Priority Data
May 23, 2008    (TW) ................ 97119025 A (51) Int. Cl.
*H01L 23/02* (2006.01)
*H01L 21/44* (2006.01)

(52) U.S. Cl. ... 257/678; 257/684; 257/687; 257/E21.499; 257/E21.513; 257/E23.116; 438/106; 438/107; 438/110

(58) Field of Classification Search .......... 438/106, 438/107, 110, 127; 257/678, 684, 687, 690, 257/698, E21.499, E21.513, E23.116
See application file for complete search history.

(56) References Cited

U.S. PATENT DOCUMENTS

| | | | |
|---|---|---|---|
| 6,284,569 B1 | 9/2001 | Sheppard et al. | |
| 6,894,229 B1 | 5/2005 | Cheah | |
| 7,005,737 B2 * | 2/2006 | Zhao et al. | 257/707 |

* cited by examiner

*Primary Examiner* — Hsien-ming Lee (57) ABSTRACT

A semiconductor package includes a carrier, a chip, a stiffener and an encapsulant. The chip is disposed on the carrier. The stiffener is disposed around the chip, directly contacts the carrier, and is mounted on the carrier. The encapsulant is adapted to seal the chip and the stiffener.

19 Claims, 10 Drawing Sheets

SEMICONDUCTOR PACKAGE AND METHOD FOR MANUFACTURING THE SAME

CROSS REFERENCE TO RELATED APPLICATION

This application claims the priority benefit of Taiwan Patent Application Serial Number 097119025, filed on May 23, 2008, the full disclosure of which is incorporated herein by reference.

BACKGROUND OF THE INVENTION

1. Field of the Invention

The present invention generally relates to a package, and more particularly to a semiconductor package, wherein the mechanical robustness of a stiffener that can prevent a carrier (e.g. substrate) from warping during subsequent thermal processes. Also, the stiffener can be directly mounted on the carrier by the attaching force of an encapsulant. It is not necessary that the stiffener is attached on the carrier by an extra adhesive, thereby decreasing the processing step of the semiconductor package.

2. Description of the Related Art

Due to chips having high performance are required, a chip package having a thin type substrate is increasingly put in use. For example, the chip package having the thin type substrate is applied to a high-end memory, an application specific integrated circuit (ASIC) and a microprocessor having a high electrical performance demand, a high frequency demand and a high speed demand.

A typical chip package having a thin type substrate includes various conductive and insulating materials which have different coefficients of thermal expansions (CTE). For example, a chip is disposed on an upper surface of a substrate by a wire bonding process or a flip chip bonding process. An encapsulant is adapted to seal the chip and disposed on the upper surface of the substrate. A plurality of solder balls are disposed a low surface of the substrate so as form a conventional ball grid array (BGA) package. However, a thin type substrate has a problem of warping. Due to the different CTE's of various conductive and insulating materials used in the BGA package after the BGA package is packaged, the BGA package having the thin type substrate may be warped seriously during subsequent thermal processes (e.g. a reflow process). The warping of the BGA package may cause the substrate not to be co-plane so as to further have a problem of solder ball joints.

Figure 1:
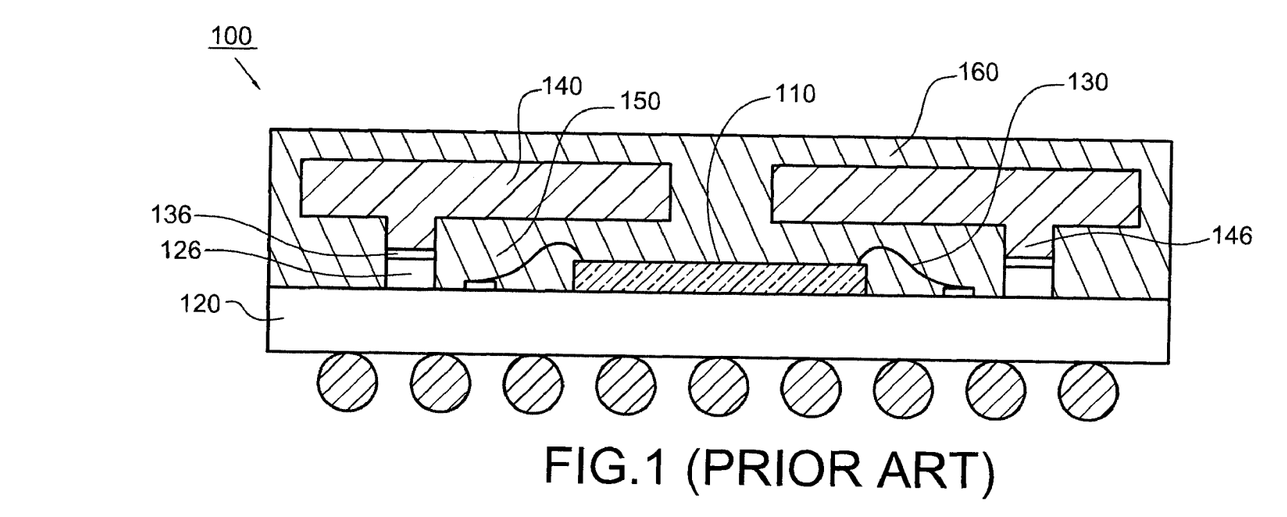
FIG. 1 is a cross-sectional view of a ball grid array package in the prior art.

Referring to FIG. 1, U.S. Pat. No. 6,894,229, entitled "Mechanically Enhanced Package and Method of Making Same", discloses a ball grid array package 100 including a substrate 120, a chip 110 and a stiffener 140. The chip 110 is mounted on the substrate 120. Ridges 146 of the stiffener 140 are attached on support pins 126 of the substrate 120. There is a space defined between the stiffener 140 and the substrate 120 for accommodating the chip 110. An encapsulant 160 is filled in the spacer 150 and covers the stiffener 140. The stiffener 140 includes metal or any other solid material which has an enough mechanically robustness and a relatively high thermal conductivity. The thermal conductivity of the stiffener 140 provides the package 100 with a thermal dissipation path, i.e. the stiffener 140 is acted as a heat spreader. The mechanical robustness of the stiffener 140 prevents the substrate 120 from warping during subsequent thermal processes.

Although the reference of U.S. Pat. No. 6,894,229 discloses that the stiffener 140 is adapted to be acted as a heat spreader and to increase the mechanical robustness of the substrate 120, the stiffener 140 needs to cover the whole area that the chip 110 is disposed on so as to affect the layout of other components (e.g. passive components). Furthermore, the height of the stiffener 140 (i.e. the heat spreader) must be higher than that of bonding wires 130 of the chip 110 so as to prevent the bonding wires 130 of the chip 110 from damage. In addition, the stiffener 140 must be attached on the substrate 120 by an adhesive 136.

Figure 2:
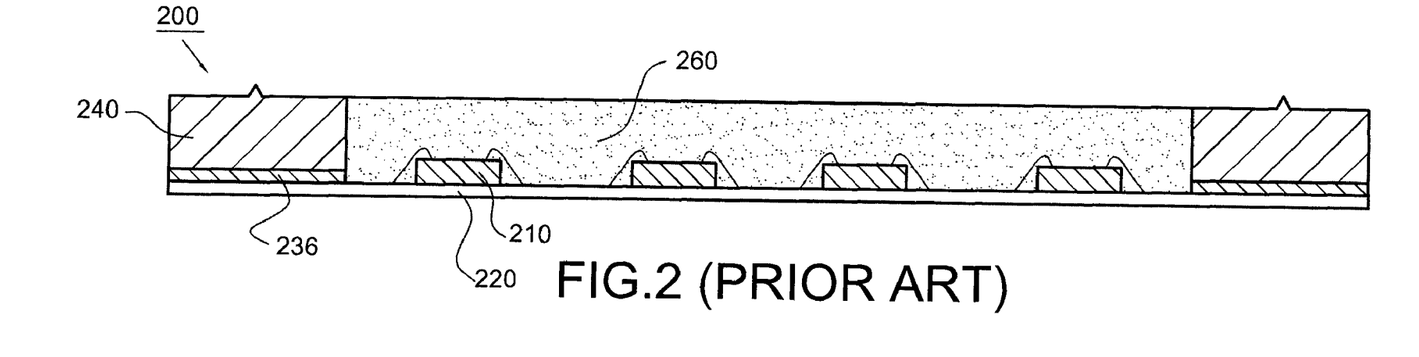
FIG. 2 is a cross-sectional view of a flexible integrated circuit package in the prior art.

Referring to FIG. 2, U.S. Pat. No. 6,284,569, entitled "Method of manufacturing a flexible integrated circuit package utilizing an integrated carrier ring/stiffener", discloses a flexible integrated circuit package 200 including a carrier ring 240. The carrier ring can provide a stiffening function for assembling flexible circuits. A matrix of chips 210 are attached on a substrate 220. The carrier ring 240 is attached on the substrate 220 by an adhesive 236, and is provided with mold gates and mold vents for use in a transfer molding step when an encapsulant 260 seals the chips 210. The height of the carrier ring 240 can control that of the encapsulant 260, and thus provides the chips 210 with a predetermined encapsulation thickness.

However, the height of the carrier ring 240 must be higher than that of the chip 210, whereby the predetermined encapsulation thickness of the chips 210 cannot be less than the height of the chips 210. In addition, the carrier ring 240 must be attached on the substrate 220 by an adhesive 236.

Accordingly, there exists a need for a semiconductor package capable of solving the above-mentioned problems.

SUMMARY OF THE INVENTION

It is an object of the present invention to provide a semiconductor package, wherein the mechanical robustness of a stiffener that can prevent a carrier (e.g. substrate) from warping during subsequent thermal processes. Also, the stiffener can be directly mounted on the carrier by the attaching force of an encapsulant. It is not necessary that the stiffener is attached on the carrier by an extra adhesive, thereby decreasing the processing step of the semiconductor package.

In order to achieve the foregoing object, the present invention provides a semiconductor package including a carrier, a chip, a stiffener and an encapsulant. The chip is disposed on the carrier. The stiffener is disposed around the chip, directly contacts the carrier, and is mounted on the carrier. The encapsulant is adapted to seal the chip and the stiffener.

The stiffener includes metal or any other solid material which has an enough mechanically robustness. The height of the stiffener of the present invention can be smaller than that of the chip, and the enough mechanical robustness of the stiffener that can prevent the carrier (e.g. substrate) from warping during subsequent thermal processes. Compared with the prior art, the height of the stiffener of the present invention is smaller than that of the chip so as to cause the stiffener of the present invention to have smaller volume. Thus, the stiffener of the present invention is more economical, and is easily sawed. Furthermore, the stiffener can include a groove adjacent to the carrier. The groove can increase an attaching area (i.e. an attaching force) between the encapsulant and the stiffener so as to directly mount the stiffener on the carrier. In addition, the stiffener of the present invention can be directly mounted on the carrier by the attaching force of the encapsulant. It is not necessary that the stiffener of the present invention is attached on the carrier by an extra adhesive, thereby decreasing the processing step of the semiconductor package.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 3:
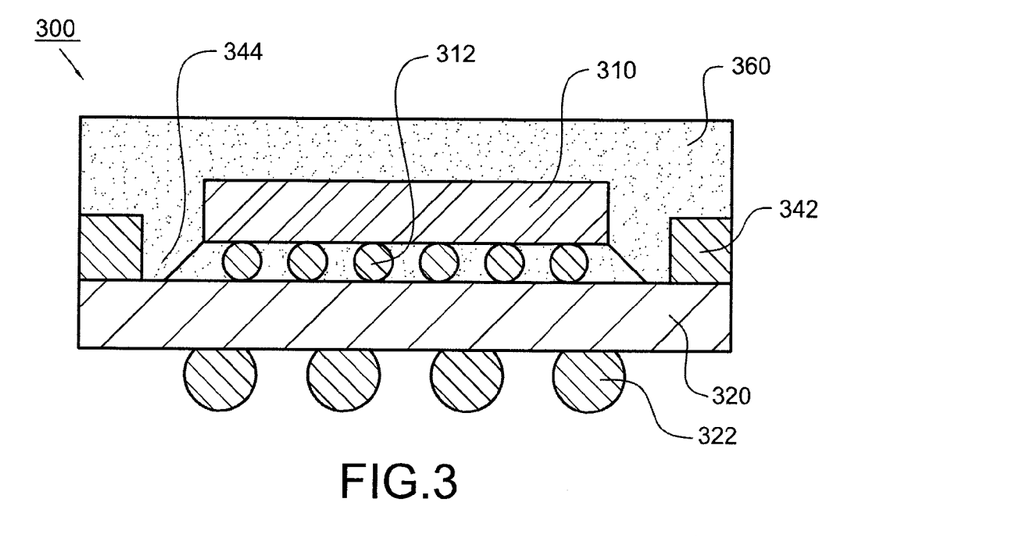
FIG. 3 is a cross-sectional view of a semiconductor package according to an embodiment of the present invention.
Figure 4:
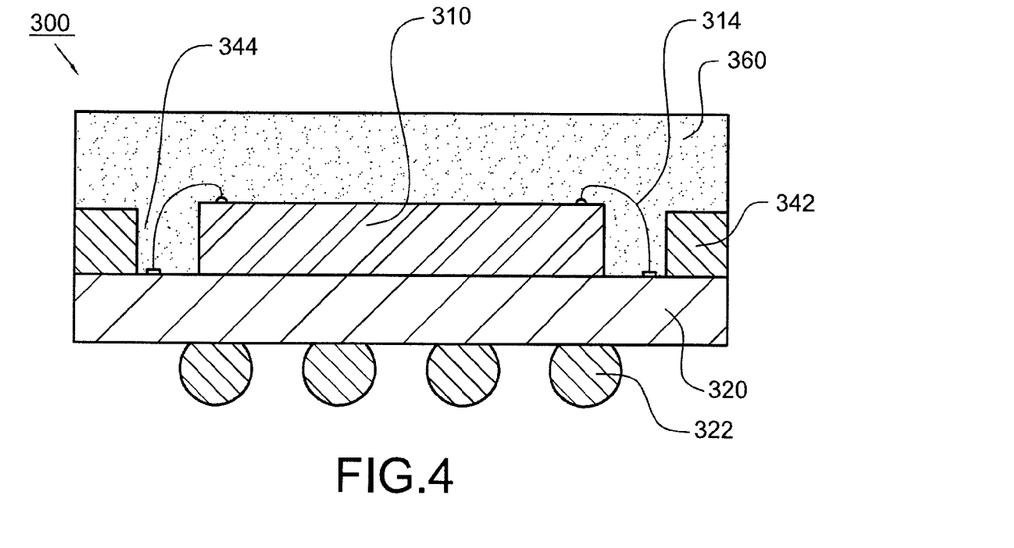
FIG. 4 is a cross-sectional view of a semiconductor package according to another embodiment of the present invention.

Referring to FIG. 3, it depicts a semiconductor package 100 according to an embodiment of the present invention. The semiconductor package 300 includes a carrier (e.g. thin type circuit board or substrate 320), a chip 310, a stiffener 342 and an encapsulant 360. The chip 310 is disposed on the substrate 320. The encapsulant is adapted to seal the chip 310 and cover the stiffener 342. A plurality of solder balls 322 are disposed on the substrate 320 for electrically connecting to an external circuit board (not shown) or an electronic device (not shown). In this embodiment, a plurality of bumps 312 are disposed between the chip 310 and the substrate 320 for electrically connecting the chip 310 to the substrate 320. Referring to FIG. 4, in another embodiment, a plurality of bonding wires 314 are adapted for electrically connecting the chip 310 to the substrate 320.

The stiffener 342 directly contacts the substrate 320, and is mounted on the substrate 320 by an attaching force of the encapsulant 360. The stiffener 342 is disposed around the chip 310, and the stiffener 342 includes a through opening 344, which is located around the chip 310. In other words, the chip 310 is located within the through opening 344. The stiffener 342 includes metal or any other solid material which has an enough mechanically robustness. The height of the stiffener 342 of the present invention can be smaller than that of the chip 310, and the enough mechanical robustness of the stiffener 342 can prevent the substrate 120 from warping during subsequent thermal processes. Preferably, the stiffener 342 can be made of a ceramic material.

Compared with the prior art, the height of the stiffener of the present invention is smaller than that of the chip so as to cause the stiffener of the present invention to have smaller volume. Thus, the stiffener of the present invention is more economical, and is easily sawed.

Figure 5:
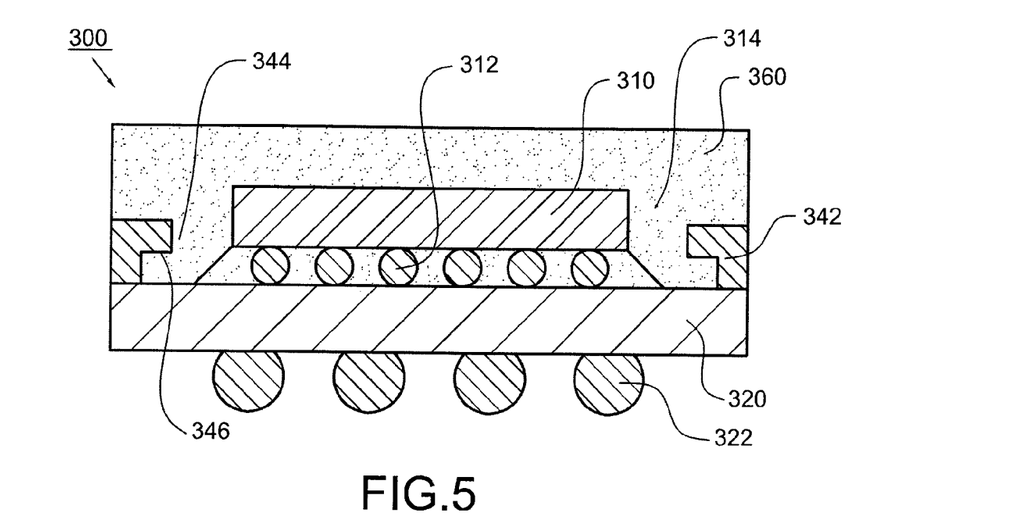
FIG. 5 is a cross-sectional view of a semiconductor package according to a further embodiment of the present invention.
Figure 6:
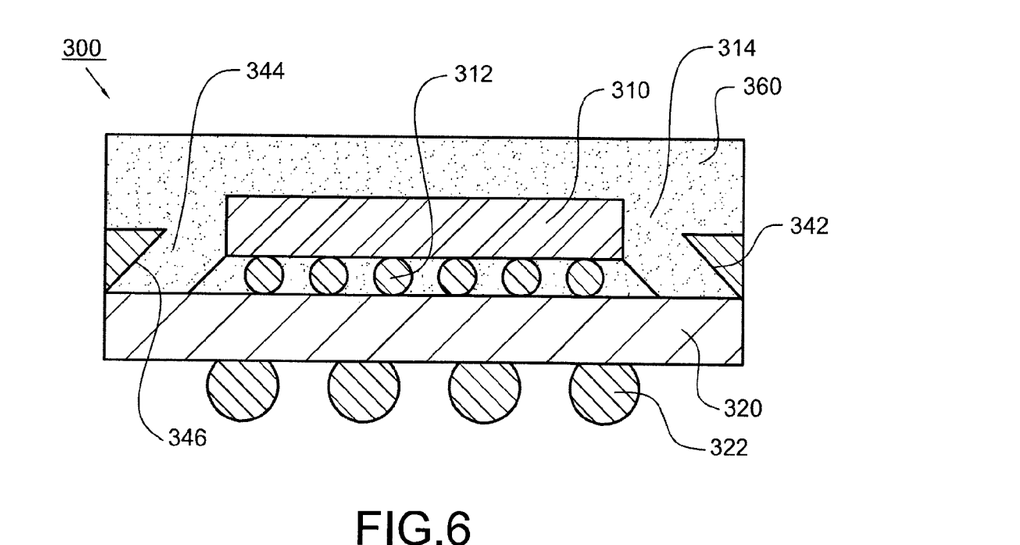
FIG. 6 is a cross-sectional view of a semiconductor package according to a still further embodiment of the present invention.

Referring to FIG. 5, in a further embodiment, the stiffener 342 can include a surface contacting the substrate 320, and the surface has a groove 346. The groove 346 is adjacent to the substrate 320. The cross-section of the groove 346 is rectangular for increasing an attaching area (i.e. an attaching force) between the encapsulant 360 and the stiffener 342 so as to directly mount the stiffener 342 on the substrate 320. Or, the groove 346 of the stiffener 342 can be a mold vent. Referring to FIG. 6, in a still further embodiment, the cross-section of the groove 346 being triangular can increase an attaching area (i.e. an attaching force) between the encapsulant 360 and the substrate 320 so as to mount the encapsulant 360 on the substrate 320, thereby preventing the semiconductor package 300 from the input of moisture.

Figure 7A:
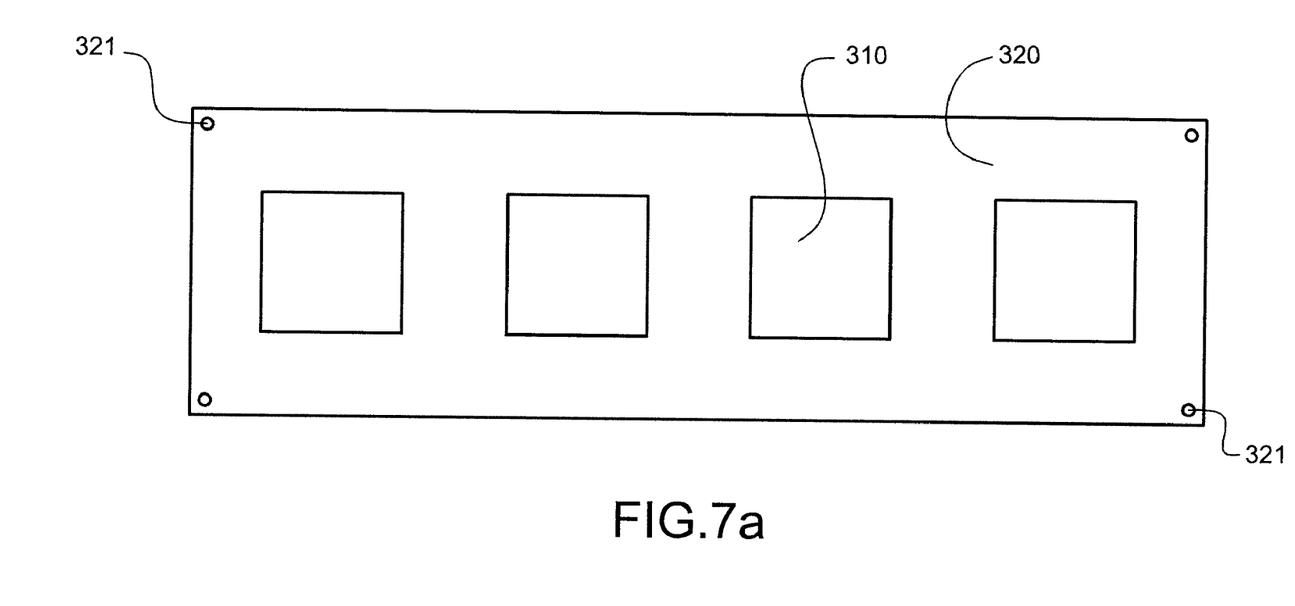
FIGS. 7a-7b to 14 are plane and cross-sectional views showing a method for manufacturing the semiconductor packages according to the first embodiment of the present invention.
Figure 7B:
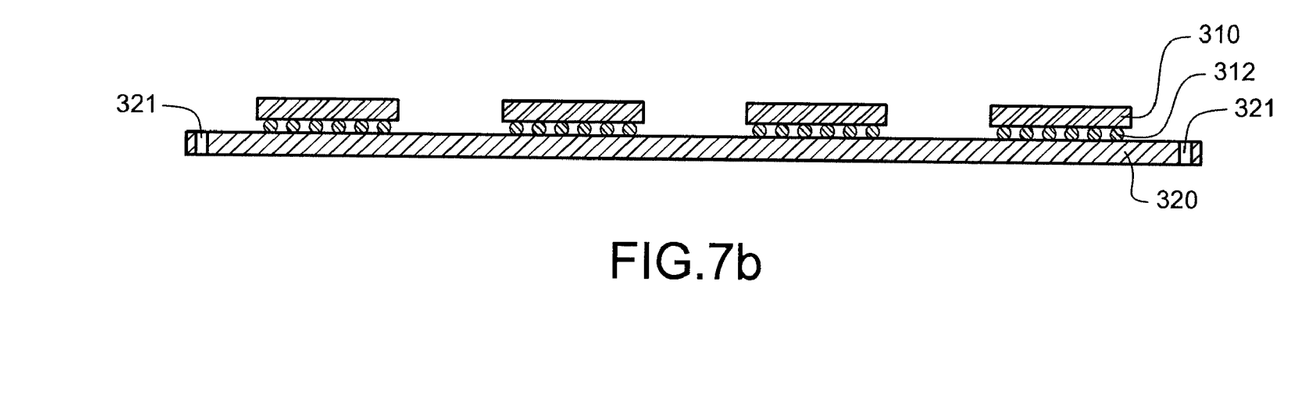
Figure 8A:
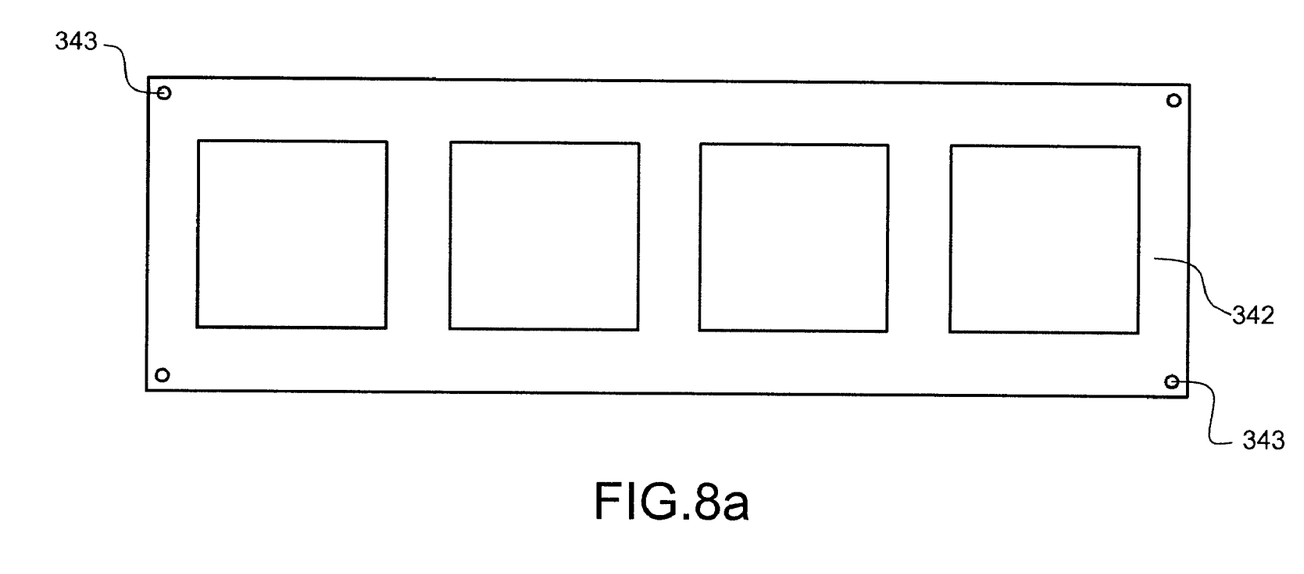
Figure 8B:
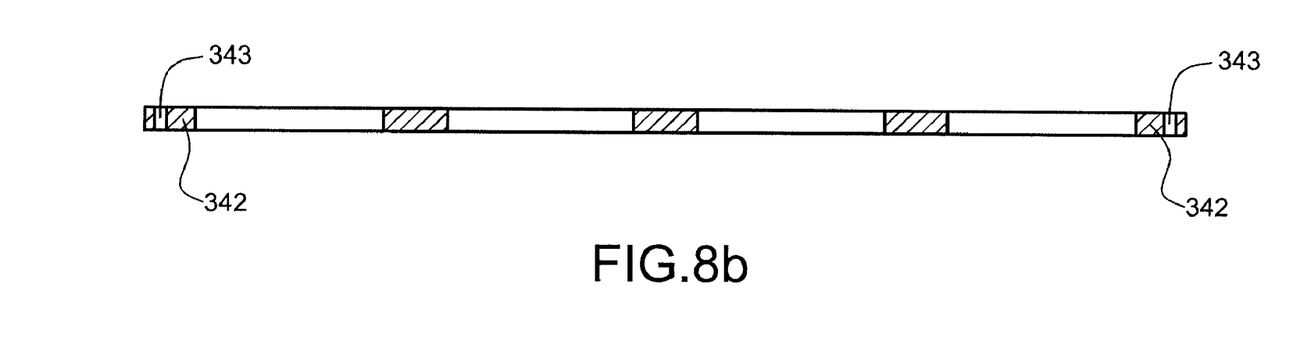
Figure 9A:
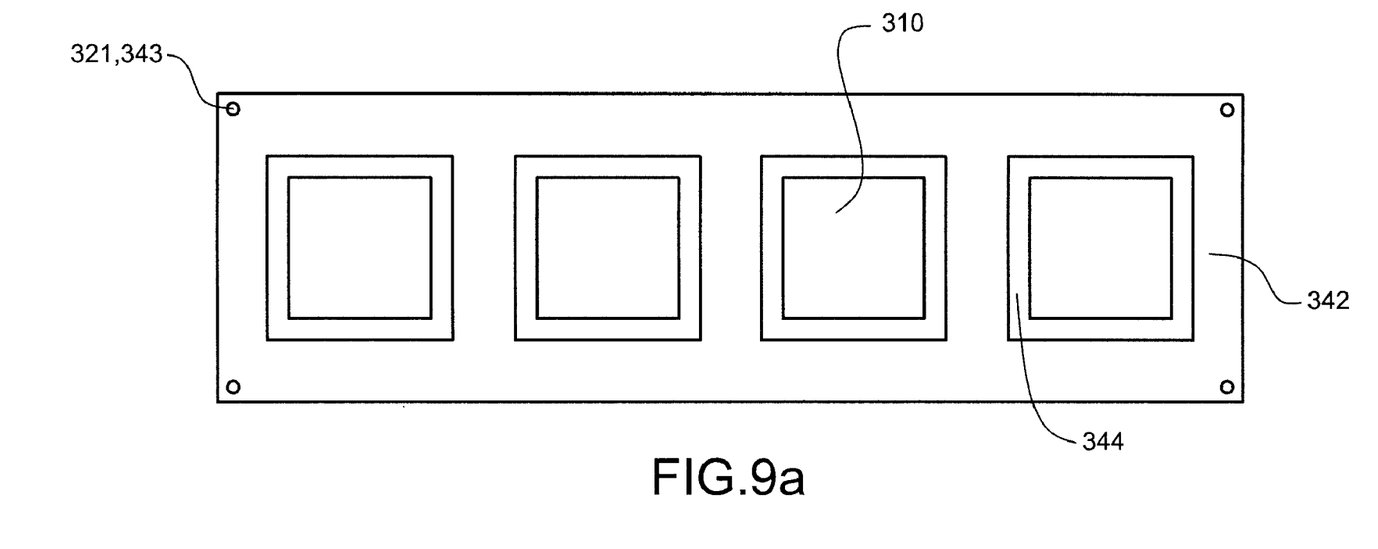
Figure 9B:
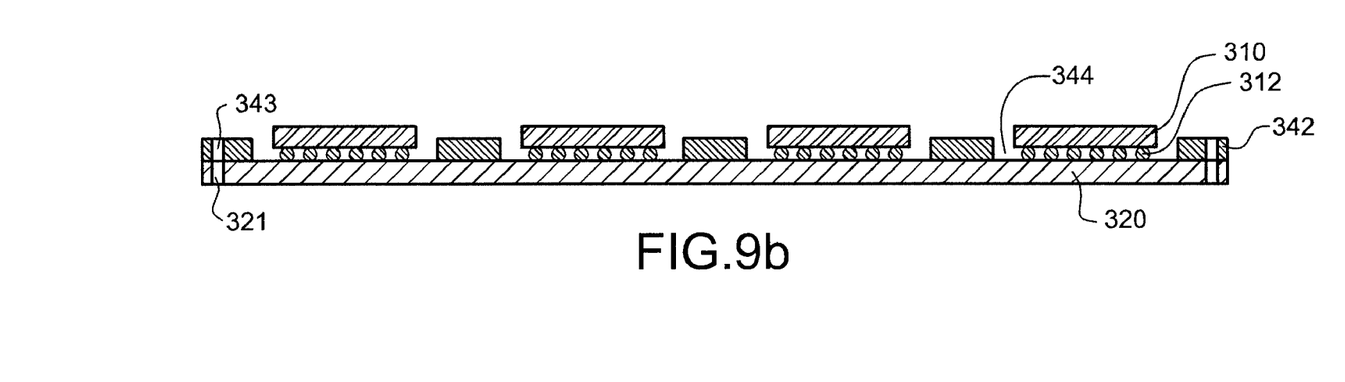
Figure 14:
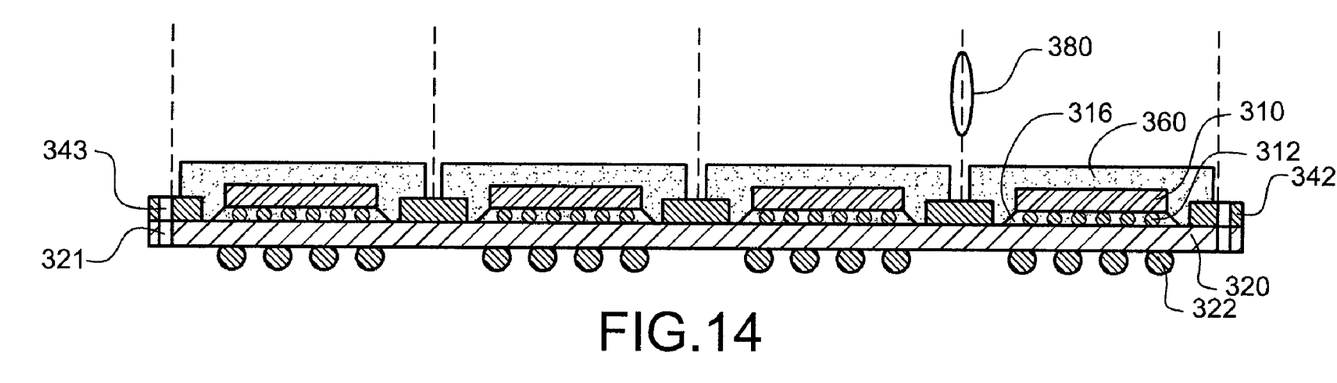

Referring to FIGS. 7a-7b to 14, they depict a method for manufacturing a semiconductor package 300 according to the first embodiment of the present invention. The method includes steps as follows. Referring to FIGS. 7a and 7b, a carrier (e.g. thin type circuit board or substrate 320) is provided, wherein the substrate 320 includes at least one first positioning hole 321. At least one chip 310 is disposed on the substrate 320. In this embodiment, the chip 310 includes a plurality of bumps 312, which are disposed between the chip 310 and the substrate 320 for electrically connecting the chip 310 to the substrate 320. Referring to FIGS. 8a-8b and 9a-9b, a stiffener 342 is disposed on the substrate 320, wherein the stiffener 342 directly contacts the substrate 320 and is disposed around the chip 310. The stiffener 342 includes a through opening 344, which is located around the chip 310. The stiffener 342 includes at least one second positioning hole 343, and the first positioning hole 321 is corresponding to the second positioning hole 343. The height of the stiffener 342 of the present invention can be smaller than that of the chip 310. In a further embodiment, the stiffener 342 can include a surface contacting the substrate 320, and the surface has a groove (not shown) adjacent to the substrate 320.

Figures 10A, 10B:
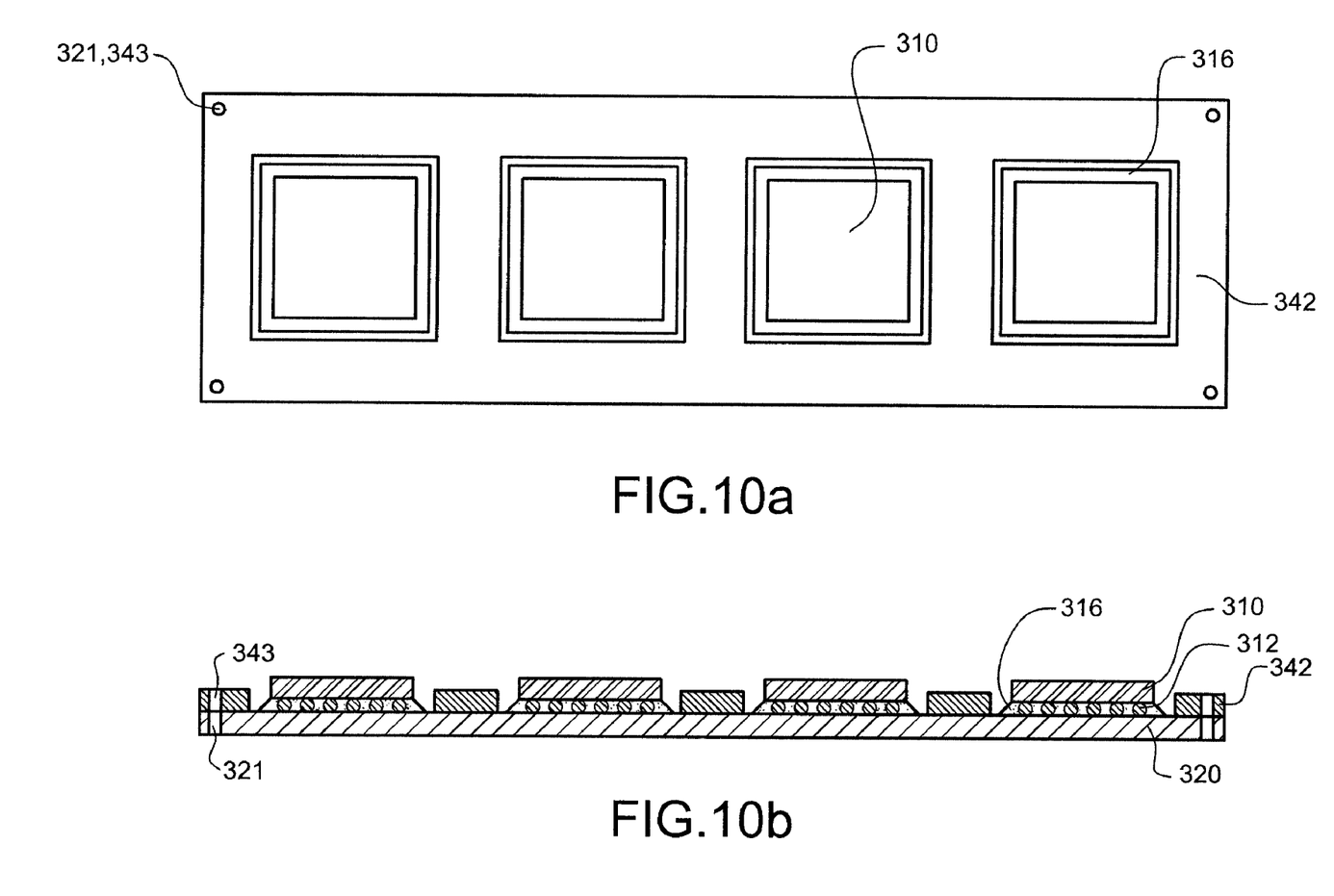
Figure 11:
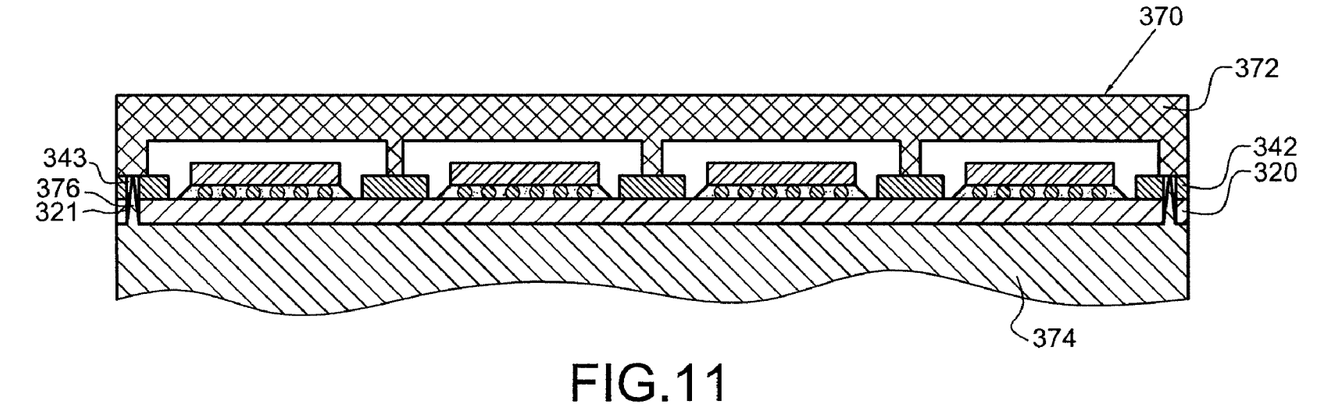

Referring to FIGS. 10a-10b, an under-fill adhesive is filled between the chip 310 and the substrate 320. Referring to FIG. 11, the stiffener 342 is temporarily mounted on the substrate 320 by an alignment step. The alignment step includes the following processes of providing a tool 370 for aligning the second positioning hole 343 of the stiffener 342 with the first positioning hole 321 of the substrate 320, and temporarily mounting the stiffener 342 on the substrate 320. More detailed, the tool 370 includes an upper mold 372 and a lower mold 374. The lower mold 374 includes a positioning pin 376 for inserting the second positioning hole 343 and the first positioning hole 321, thereby aligning the second positioning hole 343 of the stiffener 342 with the first positioning hole 321 of the substrate 320. The upper mold 372 is adapted to press the stiffener 342 and the substrate 320, thereby temporarily mounting the stiffener 342 on the substrate 320.

Figure 12:
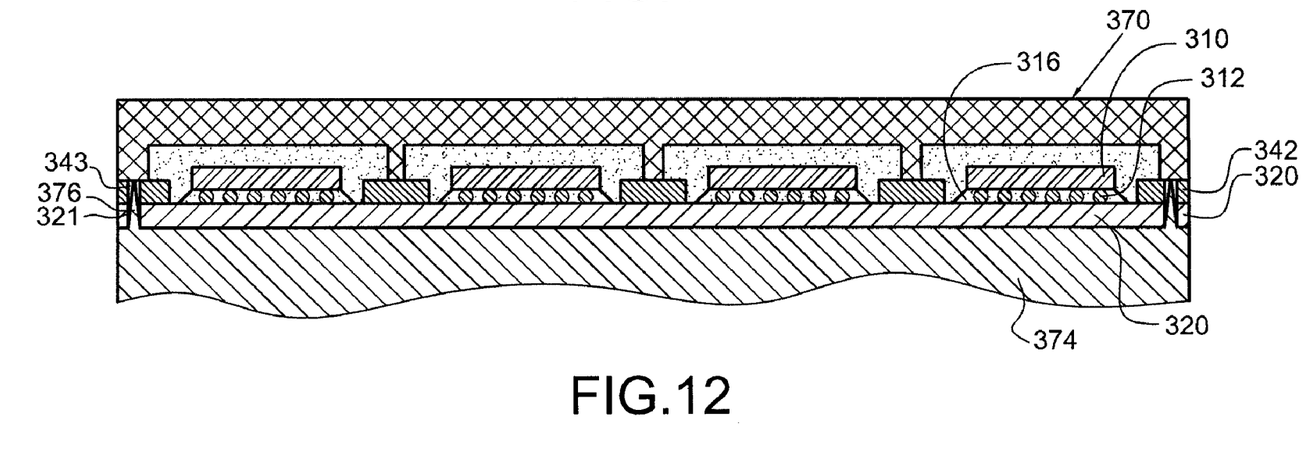
Figure 13:
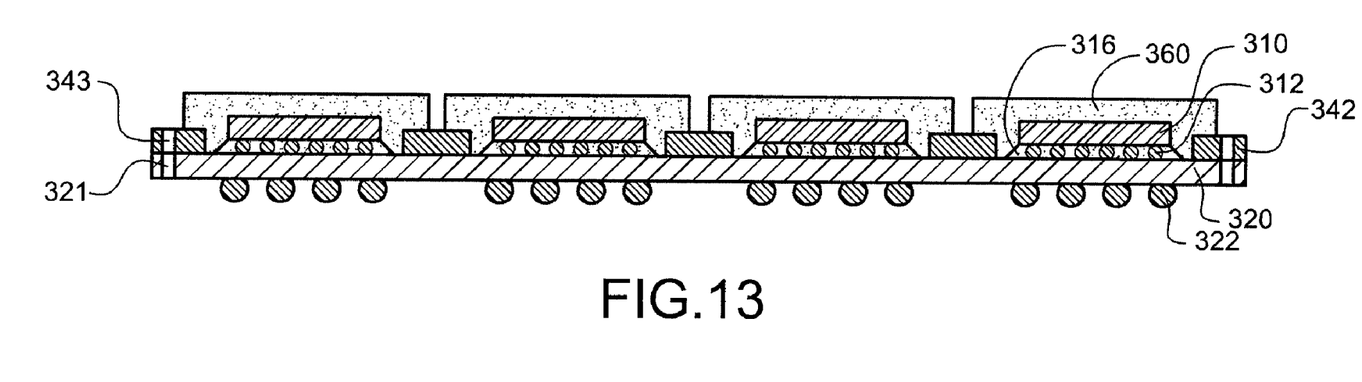

Referring to FIG. 12, an encapsulant 360 is molded for sealing the chip 310 and the stiffener 342 by an encapsulation step. Also, the stiffener 342 is mounted on the substrate 320 by an attaching force of the encapsulant 360, thereby forming at least one semiconductor package. Referring to FIG. 13, the alignment step further includes the following process of removing the tool 370. Then, a plurality of solder balls 322 are disposed on the substrate 320 for electrically connecting to an external circuit board (not shown) or an electronic device (not shown). Referring to FIG. 14, the encapsulant 360, the substrate 320 and the stiffener 342 are sawed along the sawing lines by a sawing device 380, thereby singularizing the semiconductor package 300 (shown in FIG. 3), wherein the semiconductor package 300 still include the stiffener 342. In this embodiment, the sawed semiconductor package 300 doesn't include any of the first positioning hole 321 and the second positioning hole 343. However, in another embodiment, the sawed semiconductor package 300 can include the first positioning hole 321 and the second positioning hole 343 if necessary.

Compared with the prior art, the stiffener of the present invention can be directly mounted on the substrate by the attaching force of the encapsulant. It is not necessary that the stiffener of the present invention is attached on the substrate by an extra adhesive, thereby decreasing the processing step of the semiconductor package.

Figure 15:
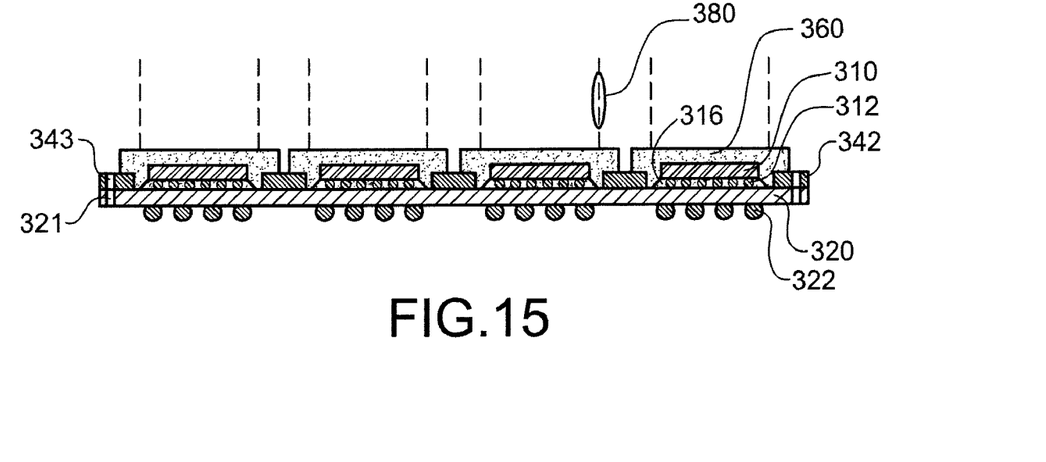
FIGS. 15 to 16 are cross-sectional views showing a method for manufacturing the semiconductor packages according to the second embodiment of the present invention.
Figure 16:
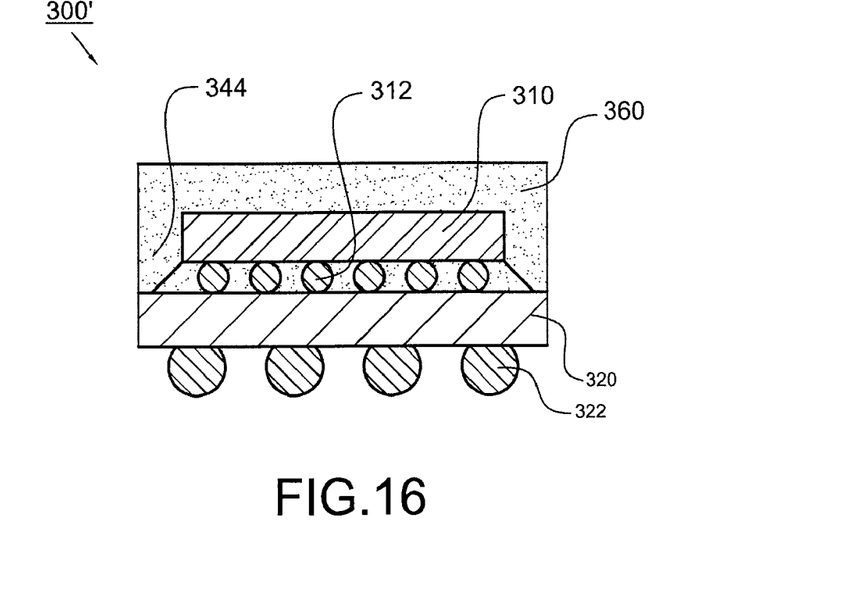

Referring to FIGS. 15 to 16, they depict another method for manufacturing a semiconductor package according to the second embodiment of the present invention. The semiconductor package 300' in the second embodiment is substantially similar to the semiconductor package 300 in the first embodiment, wherein the same elements are designated with the same reference numerals. The difference between the semiconductor packages 300', 300 is that the semiconductor package 300' does not include any stiffener. Referring to FIG. 15, the encapsulant 360 and the substrate 320 are sawed along the sawing lines by a sawing device 380, thereby singularizing the semiconductor package 300' (shown in FIG. 16), wherein the semiconductor package 300' does not include the stiffener 342 of the semiconductor package 300 in the first embodiment. Thus, the size of the semiconductor package 300' (shown in FIG. 16) in the second embodiment is smaller than that of the semiconductor package 300 (shown in FIG. 3) in the first embodiment.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
   a carrier;
   a chip disposed on the carrier and electrically connected to the carrier;
   a stiffener made of a ceramic material disposed around the chip, directly contacting the carrier, and mounted on the carrier, wherein the stiffener comprises a through opening and the chip is located within the through opening; and
   an encapsulant adapted to seal the chip and cover the stiffener.

2. The semiconductor package as claimed in claim 1, wherein the stiffener includes a surface contacting the carrier, and the surface has a groove.

3. The semiconductor package as claimed in claim 2, wherein the cross-section of the groove is triangular.

4. The semiconductor package as claimed in claim 2, wherein the cross-section of the groove is rectangular.

5. The semiconductor package as claimed in claim 1, wherein the carrier comprises at least one first positioning hole, the stiffener comprises at least one second positioning hole, and the first positioning hole is corresponding to the second positioning hole.

6. The semiconductor package as claimed in claim 1, wherein a height of the stiffener is smaller than that of the chip.

7. A method for manufacturing semiconductor packages comprising the following steps of:
   providing a carrier, wherein the carrier includes at least one first positioning hole;
   disposing at least one chip on the carrier;
   disposing a stiffener on the carrier, wherein the stiffener directly contacting the carrier, the stiffener is disposed around the chip, and the stiffener comprises at least one second positioning hole corresponding to the first positioning hole;
   temporarily mounting the stiffener on the carrier by an alignment step; and
   sealing the chip and the stiffener and mounting the stiffener on the carrier by an encapsulant so as to form at least one semiconductor package.

8. The method as claimed in claim 7, further comprising the following step of:
   sawing the encapsulant, the carrier and the stiffener, thereby singularizing the semiconductor package, wherein the semiconductor package still include the stiffener.

9. The method as claimed in claim 7, further comprising the following step of:
   sawing the encapsulant and the carrier, thereby singularizing the semiconductor package, wherein the semiconductor package does not include the stiffener.

10. The method as claimed in claim 7, wherein the alignment step comprises the following processes of: providing a tool for aligning the second positioning hole of the stiffener with the first positioning hole of the carrier, and temporarily mounting the stiffener on the carrier.

11. The method as claimed in claim 10, wherein the alignment step further comprises the following process of: removing the tool.

12. The method as claimed in claim 11, wherein the tool comprises an upper mold and a lower mold.

13. The method as claimed in claim 12, wherein the lower mold comprises a positioning pin for inserting the second positioning hole and the first positioning hole, thereby aligning the second positioning hole of the stiffener with the first positioning hole of the carrier.

14. The method as claimed in claim 12, wherein the upper mold is adapted to press the stiffener and the carrier, thereby temporarily mounting the stiffener on the carrier.

15. The method as claimed in claim 7, wherein the encapsulation step comprises the process of molding the encapsulant.

16. The method as claimed in claim 15, wherein the stiffener is mounted on carrier by an attaching force of the encapsulant.

17. The method as claimed in claim 7, wherein the stiffener includes a surface contacting the carrier, and the surface has a groove.

18. The method as claimed in claim 7, wherein a height of the stiffener is smaller than that of the chip.

19. The semiconductor package as claimed in claim 1, further comprising a plurality of bumps disposed between the chip and the carrier for electrically connecting the chip to the carrier.

* * * * *